(12) United States Patent
Ravkin et al.

(10) Patent No.: US 7,383,601 B2
(45) Date of Patent: Jun. 10, 2008

(54) SUBSTRATE BRUSH SCRUBBING AND PROXIMITY CLEANING-DRYING SEQUENCE USING COMPATIBLE CHEMISTRIES, AND METHOD, APPARATUS, AND SYSTEM FOR IMPLEMENTING THE SAME

(75) Inventors: Michael Ravkin, Sunnyvale, CA (US); John M. de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/413,916

(22) Filed: Apr. 27, 2006

(65) Prior Publication Data

US 2006/0191560 A1 Aug. 31, 2006

Related U.S. Application Data

(62) Division of application No. 10/816,432, filed on Mar. 31, 2004, now Pat. No. 7,045,018.

(51) Int. Cl.
*B08B 1/04* (2006.01)
*B08B 3/00* (2006.01)

(52) U.S. Cl. .......................... 15/77; 15/88.3; 134/99.1; 134/172; 134/902

(58) Field of Classification Search .............. 134/94.1, 134/95.1, 99.1, 172, 184, 902; 15/77, 82, 15/88.2–88.4, 102
See application file for complete search history.

(56) References Cited

U.S. PATENT DOCUMENTS

| 6,230,722 | B1 * | 5/2001 | Mitsumori et al. ..... 134/122 R |
|---|---|---|---|
| 6,446,358 | B1 | 9/2002 | Mitsumori et al. |
| 6,520,833 | B1 * | 2/2003 | Saldana et al. ................ 451/5 |
| 6,629,540 | B2 | 10/2003 | Mitsumori et al. |
| 6,711,775 | B2 * | 3/2004 | Mikhaylich et al. ............ 15/77 |
| 6,951,042 | B1 * | 10/2005 | Mikhaylichenko et al. .... 15/77 |
| 7,231,682 | B1 * | 6/2007 | Boyd et al. .................... 15/77 |
| 2002/0062842 | A1 * | 5/2002 | Mikhaylich et al. ........... 134/6 |
| 2002/0139389 | A1 * | 10/2002 | Treur .......................... 134/1.3 |
| 2003/0000034 | A1 * | 1/2003 | Welsh et al. ................... 15/77 |

* cited by examiner

*Primary Examiner*—Joseph L. Perrin
(74) *Attorney, Agent, or Firm*—Martine Penilla & Gencarella, LLP

(57) ABSTRACT

In one embodiment, a substrate preparation system is provided. The system includes a brush, a front head, and a back head. The brush is configured to brush scrub a back surface of a substrate using a brush scrubbing chemistry. The front head is defined in close proximity to a front surface of the substrate while the back head is defined in close proximity to the back surface of the substrate. The back head is positioned substantially opposite to the front head. The front head and the back head are applied as a pair to the substrate when the brush is apart from the substrate.

16 Claims, 9 Drawing Sheets

SUBSTRATE BRUSH SCRUBBING AND PROXIMITY CLEANING-DRYING SEQUENCE USING COMPATIBLE CHEMISTRIES, AND METHOD, APPARATUS, AND SYSTEM FOR IMPLEMENTING THE SAME

CROSS-REFERENCE TO RELATED APPLICATION

This Application is a Divisional of application Ser. No. 10/816,432, filed on Mar. 31, 2004, now U.S. Pat. No. 7,045,018, from which priority under 35 U.S.C. § 120 is claimed. The disclosure of this Application is incorporated herein by reference.

BACKGROUND

The present invention relates generally to substrate cleaning and drying and, more particularly, to systems, apparatuses, and methods for improving semiconductor substrate cleaning and/or drying by reducing contamination of substrate surfaces.

The fabrication of semiconductor devices involves numerous processing operations. These operations include, for example, dopant implants, gate oxide generation, intermetal oxide depositions, metallization depositions, photolithography patterning, etching operations, chemical mechanical polishing (CMP), etc. As these operations generate particles and residues, wafer surfaces need to be cleaned so as to remove particulate contaminants adhered to the surfaces of the wafer.

Particulate contaminants generally consist of tiny bits of distinctly defined material having an affinity to adhere to the surfaces of the wafer. Examples of particulate contaminants can include organic and inorganic residues, such as silicon dust, silica, slurry residue, polymeric residue, metal flakes, atmospheric dust, plastic particles, and silicate particles, among others. Particulate contaminants should be removed from wafer surfaces as the existence of such contaminants can have detrimental effects on the performance of integrated circuit devices.

Cleaning the wafer front sides (i.e., the active side or top surface) has traditionally been given a higher priority in typical wafer cleaning systems and processes because deleterious defects may be caused in the processing of the wafers. However, as wafer sizes have increased and/or feature sizes have decreased, certain shortcomings have been associated with the failure to adequately and properly clean and process wafer backsides (i.e., non-active side).

One drawback of having contaminant particulates on wafer backside is particulate contaminant migration from the wafer backside to the wafer front side. For example, the migration may occur during a wet processing step and/or as the wafer is being moved or otherwise handled between the processing or metrology tools. Furthermore, the backside contaminants can undesirably migrate from one process tools or steps thus contaminating subsequent processes.

To eliminate such drawbacks, in certain substrate processing operations, first, the wafer backside is brush scrubbed using a roller type cleaning assembly followed by conditioning of the wafer front side. In the roller type cleaning assembly, a rotating brush is brought into contact with the wafer backside as fluid is supplied onto the cleaning interface. One of such exemplary fluids is SC1 defined as a mixture of ammonium hydroxide and hydrogen peroxide. When performing the brush scrubbing, however, undesirably, the cleaning fluid SC1 can in some cases be sprayed onto the wafer front side.

At this point, the wafer front side is conditioned in a cleaning module using a conditioning fluid such as a solution of hydrofluoric acid (HF) and DIW, which is not compatible with the SC1 brush scrubbing fluid. As a consequence of wafer front side cross contamination and incompatibility of SC1 and the HF solution, the quality of the cleaning operation may be reduced.

Aside from contaminating the wafer front side, cleaning wafer front side and backside using diverse and incompatible chemistries necessitates implementing an associate fluid handling arrangement and waste treatment unit for each of the implemented chemistries. By way of example, separate drainages and exhausts should be used to eliminate each of the chemistries from the cleaning chamber. As a direct result, not only the footprint of the wafer processing system is unnecessarily increased but also the system chemical handling arrangements can become very complicated.

In view of the foregoing, there is a need for a system, apparatus, and method for preparing substrates capable of implementing simplified fluid handling arrangements through improving substrate throughput by minimizing cross contamination resulting from using incompatible chemistries.

SUMMARY

Broadly speaking, the present invention fills these needs by providing a method, apparatus, and system for preparing substrate surfaces capable of simplifying fluid handling arrangements and improving substrate throughput by minimizing cross contamination resulting from implementing incompatible chemistries. In one embodiment, a substrate is prepared by performing a brush scrubbing operation on a substrate backside using a brush scrubbing chemistry followed by proximity cleaning and/or drying the substrate front side and backside using chemistries compatible with the brush scrubbing chemistry. It should be appreciated that the present invention can be implemented in numerous ways, including as a process, an apparatus, a system, a device, or a method. Several inventive embodiments of the present invention are described below.

In one embodiment, a substrate preparation system is provided. The system includes a brush, a front head, and a back head. The brush is configured to brush scrub a back surface of a substrate using a brush scrubbing chemistry. The front head is defined in close proximity to a front surface of the substrate while the back head is defined in close proximity to the back surface of the substrate. The back head is positioned substantially opposite to the front head. The front head and the back head are applied as a pair to the substrate when the brush is apart from the substrate.

In another embodiment, a substrate preparation system is provided. The system includes a brush configured to brush scrub a back surface of a substrate using a brush scrubbing chemistry. The system also includes a front head and a back head. The front head is defined in close proximity to a front surface of the substrate and is configured to prepare the front surface of the substrate using a front meniscus. The back head is defined in close proximity to the back surface of the substrate and is positioned substantially opposite to the front head. The back head is further configured to prepare the back surface of the substrate using a back meniscus. The front head and the back head are applied as a pair to the substrate when the brush is apart from the substrate. The front meniscus and the back meniscus are configured to include a chemistry that is compatible with the brush scrubbing chemistry.

In yet another embodiment, a method for cleaning and drying a front and a back surface of a substrate is provided. The method includes brush scrubbing the back surface of the substrate using a brush scrubbing fluid chemistry. The method further includes forming a front meniscus with the front surface of the substrate and a back meniscus with the back surface of the substrate. Forming the front and the back meniscus is performed after the brush scrubbing of the back surface. The method further includes scanning the front surface of the substrate and the back surface of the substrate with the front and back meniscus. The front and back meniscus each includes a chemistry that is compatible with the brush scrubbing fluid chemistry.

In still another embodiment, another method for cleaning and drying a front and a back surface of a substrate is provided. The method includes brush scrubbing the back surface of the substrate using a brush scrubbing fluid chemistry. The method further includes applying a front meniscus onto the front surface of the substrate upon completing the brush scrubbing of the back surface. The front meniscus includes a front cleaning chemistry that is chemically compatible with the brush scrubbing fluid chemistry.

The advantages of the present invention are numerous. Most notably, in contrast to the prior art wherein incompatible chemistries such as SC1 and HF are used to clean wafer backside and front side, respectively, in the embodiments of the present invention, compatible chemistries are used to clean and/or dry the wafer front side and backside. Another advantage is that by using compatible chemistries to clean wafer front side and backside, fluid handling arrangements in the brush scrubbing and proximity cleaning preparation system is simplified. Still another advantage of the present invention is that by implementing compatible chemistries to brush scrub and proximity clean and/or dry wafer surfaces, the scrubbing and proximity cleaning and/or drying chamber can be free of cross contamination. This is beneficial, as by not using incompatible chemistries, the footprint of the apparatus is also reduced. Yet another advantage is that the embodiments of the present invention simplify handling of the compatible chemistries within the apparatus thus reducing mechanical cost associated with using separate flow handling components and waste treatment units for each chemistry.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention capable of simplifying fluid handling arrangements and improving substrate throughput by minimizing cross contamination resulting from implementing incompatible chemistries is provided. In one embodiment, a substrate is prepared by performing a brush scrubbing operation on a substrate backside using a brush chemistry followed by proximity cleaning and/or drying of the substrate front side and backside using chemistries compatible with the brush scrubbing chemistry. In one example, a front proximity head and a back proximity head are used to clean and/or dry substrate front side and backside substantially simultaneously, using a front and a back meniscus, respectively. The front and back meniscus, as disclosed in U.S.

patent application Ser. No. 10/261,839, filed on Sep. 30, 2002, and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES," is incorporated herein by reference in its entirety. In one implementation, the brush scrubbing chemistry and front and back chemistries used to clean wafer front and backsides are solutions of hydrofluoric acid (HF) and de-ionized water (DIW). Depending on a desired application, a concentration of HF in the brush scrubbing chemistry and front and back chemistries can be configured to be equal or different.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
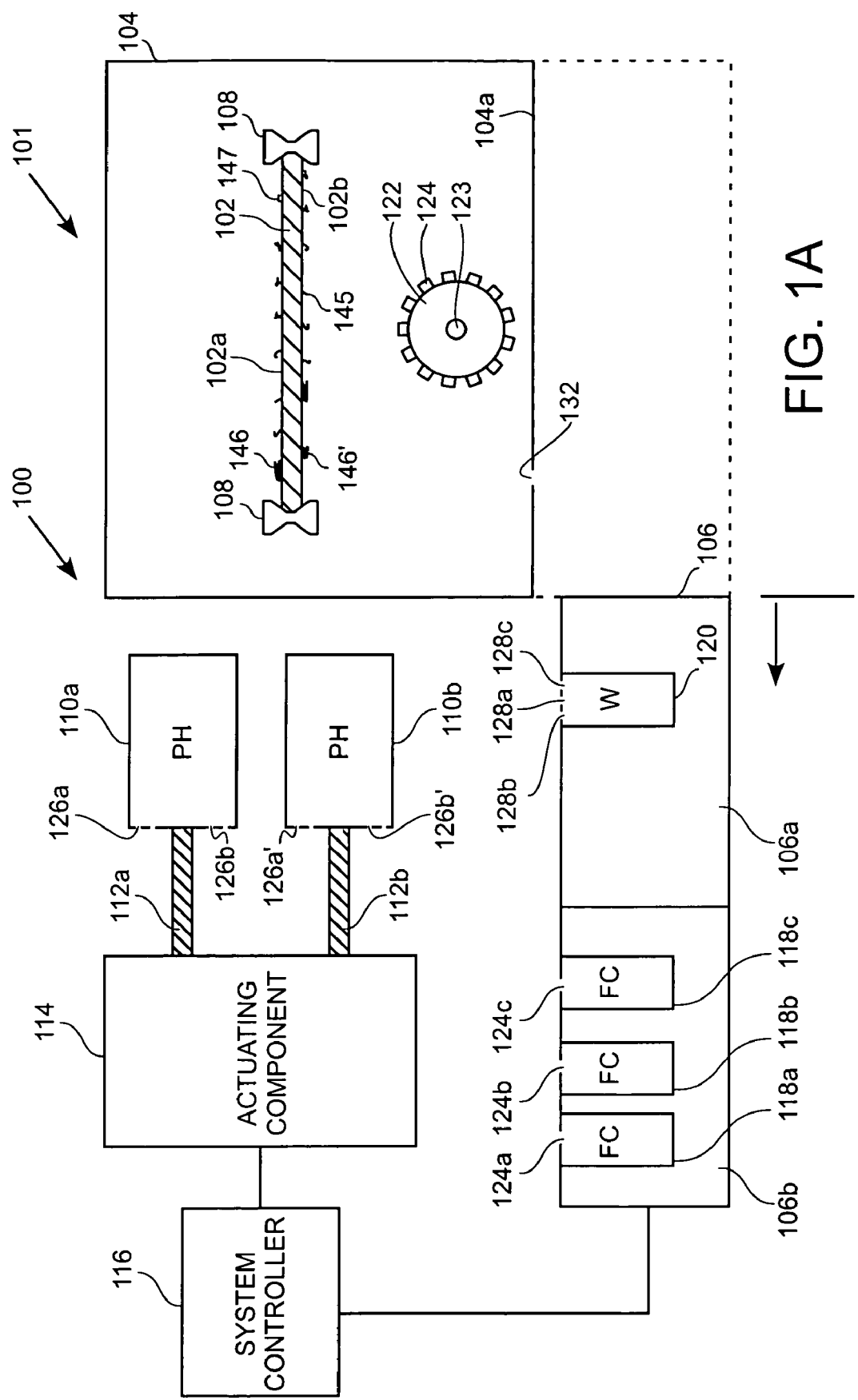
FIG. 1A is a simplified cross-sectional view of an exemplary brush scrubbing and proximity cleaning and/or drying system, in accordance with one embodiment of the present invention.

FIG. 1 is a simplified cross-sectional view of an exemplary brush scrubbing-proximity cleaning and/or drying system 100, in accordance with one embodiment of the present invention. The brush scrubbing and proximity cleaning and/or drying system 100 includes a chamber 104 disposed above a fluid handling system 106, front and back proximity heads 110a and 110b secured to an actuating component 114, and a system controller 116. Front and back proximity heads 110a and 110b are connected to the actuating component 114 by a front arm and a back arm 126a and 126b, respectively. In one embodiment, the actuating component 114 can be a motor, however, in a different embodiment, the actuating component 114 can be any component capable of moving front and back arms 126a and 126b. Furthermore, it must be appreciated by one of ordinary skill in the art that different mechanics and engineering can be implemented to move front and back arms 126a and 126b and thus front and back proximity heads 110a and 110b into and out of the chamber 104.

The chamber 104 includes a plurality of rollers 108 configured to engage and rotate a wafer 102. In one example, four rollers 108 are implemented two of which function as stabilizing members configured to engage the wafer 102. The remaining two rollers 108 are configured to cause the wafer 102 to rotate. The two stabilizing rollers 108 can be moved away so as to allow the wafer to be processed 102 to be inserted and then move back in so as to engage the wafer 102. A wafer front side 102a is shown to include contaminants 147 and liquid 146 while a wafer backside 102b is shown to include contaminants 145. In one example, wafer backside 102b may further include liquid 146'.

The chamber 104 also includes a brush 122 having a plurality of nodules 124. In the embodiment shown in FIG. 1A, the brush 122 is disposed below the wafer backside 102b and in close proximity to a chamber bottom wall 104a, thus clearing the path for application of front and back proximity heads 110a and 110b. The chamber 104 further includes a drain/exhaust outlet 132 for eliminating waste and excess fluid from the chamber 104.

The fluid handling system 106 defined below the chamber 104 can be pulled out of a scrubbing and proximity cleaning and/or drying module 101 using for example, a slide mechanism. The fluid handling system 106 includes a drainage exhaust component 106a and a flow handling component 106b. The flow handling component 106b includes a plurality of flow controllers 118a, 118b, and 118c designed to contain raw chemistry to be used in cleaning the wafer 102. Each flow controller 1118a-118c includes a source outlet 124a, 124b, and 124c, respectively.

In the same manner, the drainage/exhaust component 106a includes a waste treatment unit 120 designed to hold excess fluid, waste, residues, and contaminants being purged from the chamber 104. In the embodiment shown in FIG. 1A, waste material enters the waste treatment unit 120 through three drain/exhaust inlets 128a, 128b, and 128c defined in the waste treatment unit 120. Additional information with respect to the flow handlers 118a-118c and waste treatment unit 120 as well as mixing and supplying of chemistries to the proximity heads 110a and 110b and the brush 122 are provided below with respect to FIG. 1B.

Figure 1B:
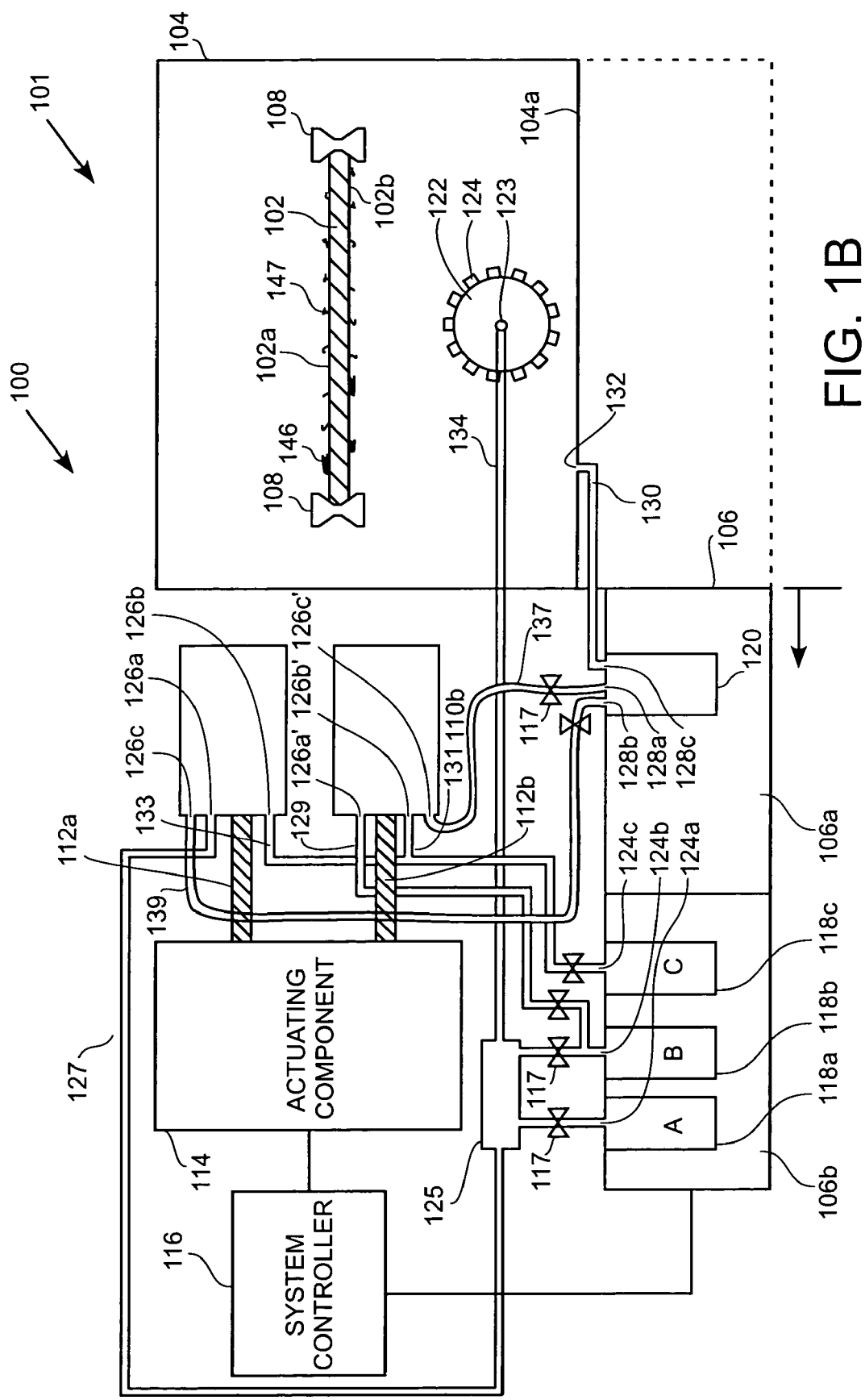
FIG. 1B is a simplified partial top view of an exemplary brush scrubbing and proximity cleaning and/or drying system illustrating supplying, delivery, and collecting of chemistries in the brush scrubbing proximity cleaning and/or drying system, in accordance with another embodiment of the present invention.

Reference is made to FIG. 1B illustrating supplying, delivery, and collecting of chemistries in the brush scrubbing proximity cleaning and/or drying system 100, in accordance with one embodiment of the present invention. A chemistry A contained within the flow controller 118a and a chemistry B contained within the flow controller 118b are shown to be mixed at a manifold 125 to a proper concentration. In one example, raw chemistry A is raw HF and chemistry B is DIW. That is, raw HF and DIW are pumped into the manifold 125 and are then mixed so as to make the front cleaning chemistry in the desired concentration.

In one example, computer software is used by the system controller 116 to monitor and maintain the desired concentration for each of the chemistries A and B. In one example, during the brush scrubbing operation, the mixture of the raw chemistry A and B (e.g., the solution of HF) can be supplied to the brush 122 through a supply tube 134. Thereafter, during proximity cleaning and/or drying, the same solution of HF can be supplied to the front proximity head 110a through supply tube 127 while DIW is supplied to the back proximity head 110b through supply tube 129. In the illustrated embodiment, chemistry A and DIW are directed to the manifold 125 through source outlets 124a and 124b so that HF can be mixed with DIW to an appropriate concentration. Thereafter, the solution of HF is supplied to the front proximity head 110a while DIW water is supplied to the back proximity head 110b through fluid inlet 126a and 126b defined in front and back proximity heads 110a and 110b, respectively.

In the same manner, chemistry C is shown to be supplied to the front and back proximity heads 110a and 110b using supply tubes 131 and 133, respectively. As shown, chemistry C is fed to the supply tube using the source outlet 124c, and then to front and back proximity heads 110a and 110b through fluid inlets 126b and 126b'. In one example, chemistry C is Isopropyl alcohol (IPA) vapor, which uses $N_2$ as a carrier gas. As can be seen, valves 117 are used to control the flow of chemistries from flow controllers 118a-118c as well as the waste treatment unit 120. In one example, operation of valves 117 are controlled and monitored by the system controller 116.

As illustrated, waste materials such as chemistries, contaminants, and liquids vacuumed from over the wafer front side 102a and wafer backside 102b are drained from front and back proximity heads 110a and 110b through tubes 137 and 139, respectively. Vacuumed waste materials are fed into the tubes 137 and 139 through a waste outlet 126c and a waste outlet 126c' defined in front and back proximity heads 110a and 110b. Thereafter, the waste materials are delivered to the waste treatment unit 120 through waste inlets 128a and 128b. In the same manner, chemistry supplied onto the wafer backside 102b during the brush scrubbing and proximity cleaning operation of wafer front and back sides 102a and 102b as well as the contaminants are purged from the chamber 104 via a tube 130, and through the waste outlet 132 defined in the chamber bottom wall 104a, and then into the waste treatment unit 120 through a waste inlet 128c.

According to one embodiment, the chemistry A used to clean the wafer backside 102a during the brush scrubbing operation can be used as the chemistry for proximity cleaning and/or drying operation performed on the wafer front side 102a. In this manner, the brush scrubbing proximity cleaning and/or drying system of the present invention can be smaller and have smaller foot print than brush scrubbing modules of the prior art. Furthermore, by using the same type of chemistry or compatible chemistries to brush scrub the wafer backside 102b and clean and/or dry the wafer front side 102a using the front proximity head 120a, the need to use separate waste components for each chemistry is eliminated. In this manner, the same drainage and exhaust components can be used to eliminate waste fluids and contaminants from the chamber 104.

Figure 2A:
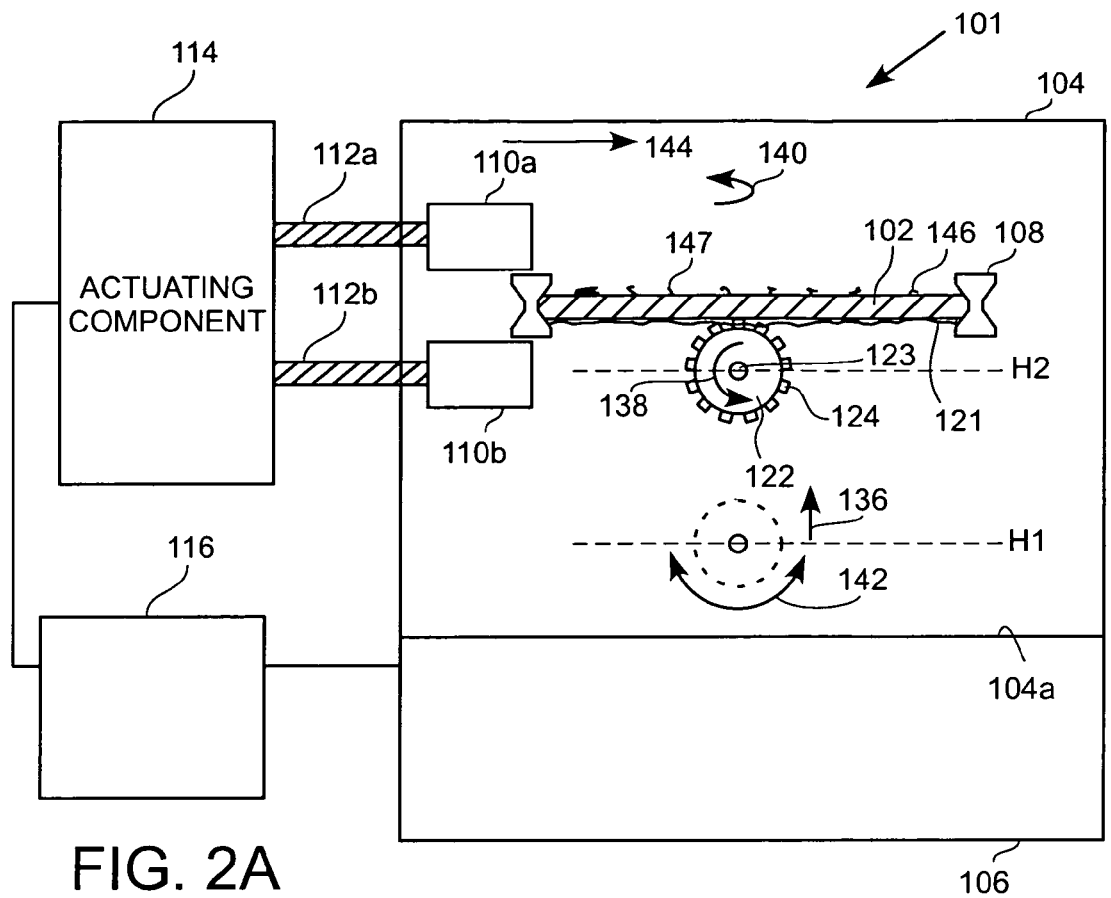
FIG. 2A is a simplified cross-sectional view of a brush scrubbing and proximity cleaning and/or drying system, in accordance with yet another embodiment of the present invention.

Proceeding to the simplified, cross sectional view shown in FIG. 2A, brush scrubbing the wafer backside 102b using the brush 122 in the brush scrubbing proximity cleaning and/or drying system 100 of the present invention is provided, in accordance with one embodiment of the present invention. Cleaning the wafer backside 102b is commenced by bringing the brush 122 into contact with the wafer backside 102b. In one embodiment, the brush 122 originally defined in the vicinity of the chamber bottom wall 104a at a height H1 is moved to a height H2 in a direction 136. At this point, brush 122 and thus nodules 124 of the brush 122 are applied to the wafer backside 102b as the brush 122 rotates in a rotation direction 122 and is moved across the wafer backside 102b in an arc-like direction 142 as the wafer 102 is rotated in the rotation direction 140.

In the embodiment in FIG. 2A, front and back arms 112a and 112b transport corresponding front and back proximity heads 110a and 110b into the chamber 104 before commencing the brush scrubbing operation. Front and back proximity heads 110a and 110b are transported into the chamber 104 until front and back proximity heads 110a and 110b are defined bordering above and below the roller 108, respectively, so as not to interfere with the brush scrubbing operation. In this manner, front and back proximity heads 110a and 110b can start proximity cleaning and drying wafer front side and backside 102a and 102b almost immediately after the conclusion of the brush scrubbing operation. Of course, one of ordinary skill in the art must appreciate that in a different embodiment, front and back proximity heads 110a and 110b may be transported into the chamber 104 at any appropriate time, before, during, and after the brush scrubbing operation. It must further be appreciated that in one implementation, the wafer front side and backside can be brush scrubbed using a brush scrubbing chemistry followed by proximity cleaning and/or drying wafer front side and backside.

Upon completion of the brush scrubbing operation, the wafer front side 102a and the wafer backside 102b are cleaned and/or dried using the same chemistry or a chemistry compatible with the brush scrubbing chemistry, substantially reducing the possibility of cross contamination of the wafer front side 102a by the brush scrubbing chemistry. Once front and back proximity heads 110a and 110b have concluded cleaning and/or drying wafer front side and backside 102a and 102b, front and back proximity heads 110a and 110b are transported out of the chamber 104 using front and back arms 112a and 112b, respectively.

In one exemplary embodiment, the brush 122 can be mounted on a brush core secured to a shaft. As shown, the outer surface of the brush 122 is covered with a plurality of nodules 144 that are brought into contact with the wafer backside 102b during the brush scrubbing operation so as to remove the contaminants 145 from over the wafer backside 102b.

Figure 2B:
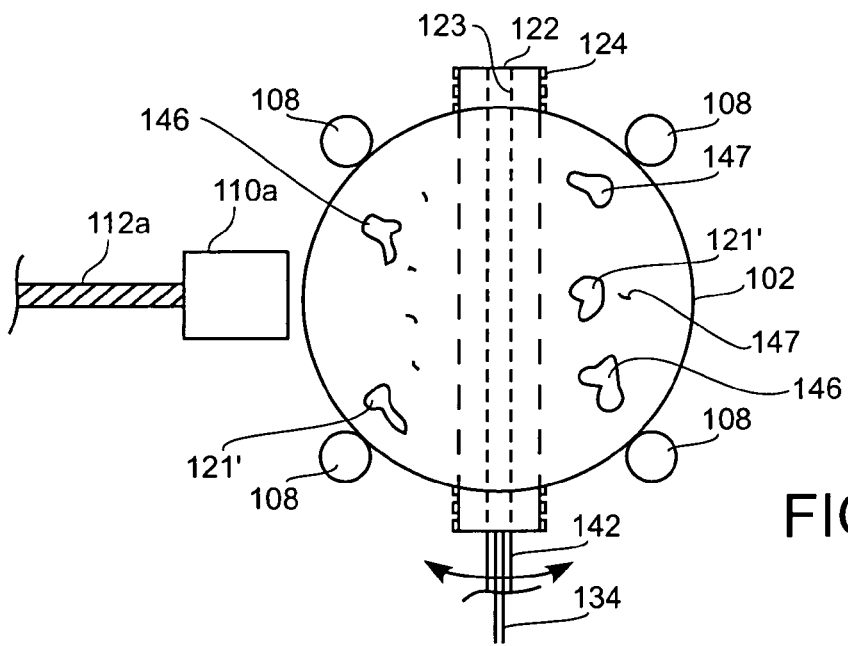
FIG. 2B is a simplified top view diagram illustrating brush scrubbing of the wafer backside using the brush, in accordance with still another embodiment of the present invention.

FIG. 2B is a simplified top view diagram illustrating brush scrubbing of the wafer backside 102b using the brush 122, in accordance with one embodiment of the present invention. As shown, while front and back proximity heads 110a and 110b are defined within the chamber 104 and bordering an edge of the wafer 102, the back proximity head 110b borders the edge of the wafer 102 such that the back proximity head is defined outside the path of the brush 122 as the brush moved to be applied and being moved so as to be applied across the wafer backside 102b following the arc movement direction 142. The brush scrubbing chemistry is shown to have encroached on the wafer front side 102a forming drops 121' of brush scrubbing chemistry 121.

A brush core 123 is connected to a fluid inlet designed to supply brush scrubbing chemistry 121 into the brush cores 123 through a supply tube 134 disposed inside a shaft 143. In one example, the shaft 143 is used to apply the brush 122 onto the wafer backside 102b and move the brush 122 between heights H1 and H2. Although not shown, brush core 123 has a plurality of holes thereon, allowing brush scrubbing chemistry to exit the brush core 123 so as to flush the brush 122.

Once brush scrubbing the wafer backside 102b has concluded, the brush 122 is transported so as to assume the initial position, below the wafer 102 at height H1. In this manner, the brush 122 cannot obstruct the path of the front and back proximity heads 110a and 110b during proximity cleaning and/or drying.

Removing contaminants 145 from over the wafer backside 102b by scrubbing and rinsing the wafer backside 102b is achieved by supplying brush scrubbing chemistry 121 into the scrubbing interface through the brush (TTB), saturating the brush 122 with the brush scrubbing chemistry, and brush scrubbing the wafer backside 102b with brush scrubbing chemistry 121 for a desired time. Then, in one aspect, the wafer backside 102b can be rinsed TTB as the brush 122 is flushed and saturated with DI water so as to remove brush scrubbing chemistry 121 and any contaminants 145 remaining on wafer backside 102b. Of course, it must be noted that although in the illustrated embodiment the brush scrubbing chemistry 121 is introduced onto the wafer backside 102b TTB, in a different embodiment, the brush scrubbing chemistry 121 can be introduced into the brush 122 and the wafer backside 102b in any suitable manner (e.g., dispense nozzles attached to the arm designed to dispense fluid at the contact interface, a dispense nozzle located outside the diameter of the wafer, etc.).

In one embodiment, the brush scrubbing chemistry 121 implemented to scrub the wafer backside 102b can be diluted so as to have a desired concentration. In this manner, once brush scrubbing the wafer backside 102b has been achieved, penetration of any brush scrubbing chemistry 121 onto the wafer front side 102a cannot result in cross contaminating the wafer front side 102a during subsequent cleaning operations, as the wafer front side 102a is cleaned using either the same chemistry as the back cleaning chemistry or any other chemistry being compatible with the brush scrubbing chemistry 121. Furthermore, depending on the application, different concentration of chemistries can be implemented.

According to one preferred embodiment, HF can be used as the brush scrubbing chemistry 121 to chemically assist removing contaminants 145 defined on the wafer backside 102b, in the same manner as the SC1 chemistry. In one example, the concentration of HF is about 100:1. In another embodiment, the concentration of HF is approximately about 1000:1. Of course, it must be noted that any other chemistry suitable to remove contaminants 145 from wafer backside 102b can be used so long as the chemistries implemented in the module are chemically compatible (e.g., buffered Oxide Etch (BOE), HF and citric acid, HF and oxidizer ($H_2O_2$), etc.).

In one embodiment, the brush 122 is configured to rotate between approximately about 50 and 400 RPMs, and a more preferred range of approximately about 200 and 400 RPMs and most preferably approximately about 200-250 RPMs during the brush scrubbing and rinsing operations. Furthermore, in one implementation, the flow rate of the rinse fluid can be between approximately about 0.5 and 2 liters/minute, and a more preferred range of approximately about 0.7 and 1.5 liter/minutes, and most preferably approximately about 1 liter/minute during the rinse operation. In another embodiment, the flow rate of brush scrubbing chemistry can be between approximately about 0.3 and 1.5 liters/minute, and a range of approximately about 0.5 and 1.0 liter/minutes, and most preferably approximately about 0.7 liter/minute during the brush scrubbing operation. Additionally, in one example, the wafer 102 can be configured to rotate between approximately about one (1) rotation per minute (RPM) and 50 RPMs, and a more preferred range of approximately about 2 and 30 RPMs and most preferably approximately about 10 RPMs during the brush scrubbing and rinse operations.

In accordance with one embodiment of the present invention, the brush 122 can be made out of polyvinyl alcohol (PVA) foam. The PVA material can have any surface topography and in one embodiment, the surface can be smooth. In a different embodiment, however, the brush 122 can be made out of a material suitable for processing the wafer back side 102b (e.g., nylon, mohair, a mandrel wrapped with a polishing pad material, a polyurethane roller, high density PVA, Politex, polyurethane compounds (e.g., IC1000 (Rodel) polishing pads, etc.), etc.). Yet further, in another embodiment, the brush 122 can be configured to be a removable and disposable brush.

Figure 3A:
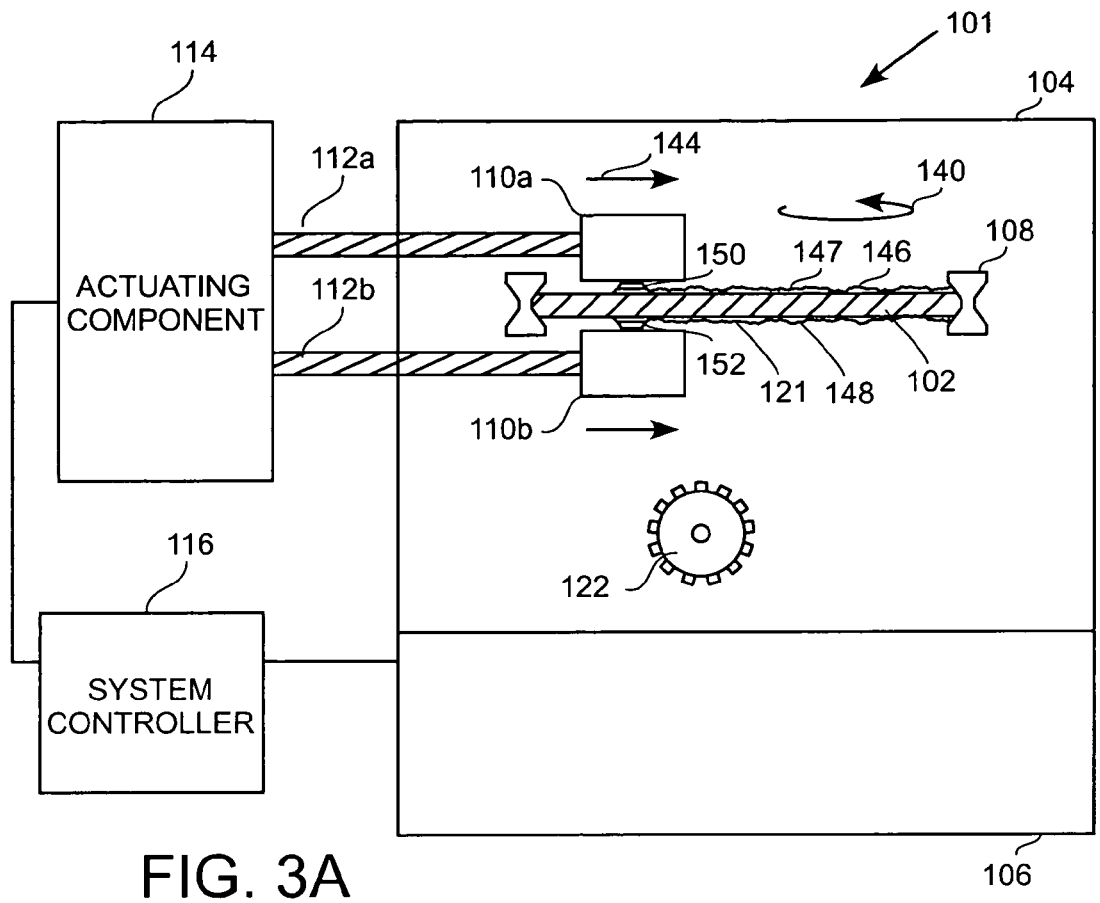
FIG. 3A is a simplified cross sectional view illustrating proximity cleaning and/or drying of the wafer front and backsides employing a chemistry compatible with the brush scrubbing chemistry, in accordance with still another embodiment of the present invention.

Proceeding to the simplified cross sectional view of the brush scrubbing proximity cleaning and/or drying system 100 illustrated in FIG. 3A, proximity cleaning and/or drying the wafer front side 102a and wafer backside 102b employing a chemistry compatible with the brush scrubbing chemistry can further be understood, in accordance with one embodiment of the present invention. Wafer front side and backside 102a and 102b are cleaned and/or dried by front and back proximity heads 110a and 110b while front and back proximity heads 110a and 110b move in a movement direction 144 along a radius of the wafer 102 using a front and back menisci 150 and 152. As used herein, the portion of fluids (e.g., front chemistry, rinse fluid, IPA vapor, etc.) defined in the region between the front proximity head 110a and the wafer front side 102a is defined as the front meniscus 150. In the same manner, the back meniscus 152 is generated using the back cleaning chemistry, if any, or DIW and IPA vapor.

Still referring to FIG. 3A, front and back proximity heads 110a and 110b are brought and held in close proximity to the corresponding wafer front side and backside 102a and 102b by the front and back arms 112a and 112b moving front and back proximity heads 110a and 110b in a vertical manner.

Thus, when front and back proximity heads 110a and 110b are moved horizontally in the direction 144 to assume a position bordering the roller 108 so that brush scrubbing operation can be initiated, proximity heads 110a and 110b are moved vertically to respective positions in close proximity to wafer front side and backside 102a and 102b. One must appreciate that close proximity, as used herein, may be any suitable distance from wafer front side and backside 102a and 102b as long as corresponding front and back meniscus 150 and 152 can be maintained with respect to wafer front side and backside 102a and 102b. In one embodiment, proximity heads 10a and 10b may each be moved to between about 0.1 mm to about 10 mm from wafer front side and backside 102a and 102b to initiate wafer processing operations, and preferably, between about 0.5 mm to about 4.5 mm from the wafer front side and backside 102a and 102b.

In the embodiment shown in FIG. 3A, front and back proximity heads 110a and 110b move horizontally in the direction 144 along the radius of the wafer 102. However, it should be appreciated that front and back proximity heads 110a and 110b can be moved in any suitable manner with respect to the wafer 102 so as to clean and/or dry the wafer 102, as desired. By way of example, front and back proximity heads 110a and 110b can be moved from the center of the wafer 102 to the edge of the wafer. Furthermore, it must be noted that front and back proximity heads 110a and 110b may have any suitable size or shape as shown by, for example, in FIGS. 4A and 4B. Yet further, one must appreciate that front and back proximity heads 110a and 110b can have numerous types of configurations capable of performing the processes described herein.

According to one embodiment, proximity cleaning and/or drying wafer front side and backside 102a and 102b by respective front proximity head 110a and back proximity head 110b results in creating a clean and/or dry area which may expand from the center region to the edge region of the wafer 102 in a spiral manner. However, it must be noted that any suitable cleaning and/or drying path may be generated by changing the configuration of the system 100, the orientation of proximity heads, or movement of proximity heads.

According to one implementation, the front meniscus 150 is formed between the front proximity head 110a and the wafer front side 102a and a back meniscus 152 is formed between the back proximity head 110b and the wafer backside 102b. Front and back meniscus 150 and 152 traverse wafer front and backsides 102a and 102b to clean and/or dry wafer surfaces by applying front and back cleaning chemistries correspondingly so as to remove contaminants and fluids from over wafer front and back sides 102a and 102b. In one embodiment, the rotation of the wafer 102 by rollers 108 serves to move a wafer area that has not been processed into close proximity to front and back proximity heads 110a and 110b.

As can be appreciated, the rotation of rollers 108 causes the wafer 102 to rotate, thus allowing substantially entire surfaces of wafer front side and backside 102a and 102b be cleaned and/or dried. As will be described in more detail below, in operation, front and back proximity heads 110a and 110b remove contaminants and fluids from wafer front and backsides 102a and 102b by respectively applying and evacuating isopropyl alcohol (IPA), deionized water (DIW), and front cleaning chemistry to the wafer front side 102a, and IPA and DIW to the wafer backside 102b.

It should be appreciated, however, that in one example, different front and back chemistries could be applied to wafer front side and backside 102a and 102b, respectively, depending on the application desired. Depending on the application, front and back cleaning chemistries may be the same type of chemistry having the same or different concentrations, or front and back chemistries can be different compatible chemistries. It must further be appreciated that the wafer 102 may be engaged in any suitable orientation as long as the orientation enables front and back proximity heads 110a and 110b to be in close proximity to a portion of corresponding wafer front side and backside 102a and 102b to be cleaned or dried.

With continued reference to FIG. 3A, the portion of the wafer front side 102a defined ahead of the leading edge of the front proximity head 110a is partially covered by liquid 146, contaminants 147, drops 121' of the brush scrubbing chemistry 121 used to clean the wafer backside 102b. As illustrated, the portion of the wafer backside 102b defined ahead of the leading edge of the back proximity head 110b can be partially covered by brush scrubbing chemistry 121 and contaminants 145. The trailing edges of front and back proximity heads 110a and 110b, however, are shown to be visually dry. As used herein, a leading edge of a proximity head is defined as the area between the proximity head and the wafer surface defined in front of the meniscus. In a like manner, the trailing edge of the proximity head is the area between the proximity head and the wafer surface defined at the back of the meniscus.

One of ordinary skill in the art must appreciate that the IPA inflow may be in any suitable form such as, for example, IPA vapor where IEPA in vapor form is inputted through use of a $N_2$ gas. In a like manner, although several embodiments of the present invention have been described as using DIW, in another embodiment, any other suitable fluid may be utilized that may enable or enhance the wafer processing such as, for example, water purified in other ways, cleaning fluids, etc.

In one example, proximity cleaning and/or drying wafer front and back side 102a and 102b can be described as follows: The front cleaning chemistry inflow and the IPA inflow are applied onto the wafer front side 102a, thus causing any liquid 146 and drops 121' of the brush scrubbing chemistry 121 defined on the wafer front surface 102a to be intermixed with the front cleaning chemistry inflow. At this time, front cleaning chemistry and DIW inflows, as applied onto the wafer front side 102a, encounter the IPA inflow. As a result, the applied front cleaning chemistry and DIW inflows reside in the region between the front proximity head 110a and the wafer front side 102a along with the liquid 146 and brush chemistry liquid 121 defined on a portion of the wafer front side, forming the front meniscus 150. Therefore, front and back meniscus 150 and 152 are constant flows of fluid being applied toward the corresponding wafer front side 102a and wafer backside 102b and can be removed along liquid 146 and brush scrubbing chemistry 121 on the wafer front side 102a at substantially the same time.

Accordingly, as the front proximity head 110a scans the wafer front side 102a, the front meniscus 150 moves along with the front proximity head 110a. In this manner, the region of the wafer front side 102a previously occupied by the front meniscus 150 is cleaned and dried as a result of the movement of the front meniscus 150 as applying the meniscus and removal of fluid is achieved substantially simultaneously.

In a like manner, the wafer backside 102b is cleaned and/or dried. In one embodiment, as will be explained in more detail below, a diluted HF inflow, DIW inflow, and IPA vapor inflow are applied onto the wafer backside 102b forming the back meniscus 152. In such embodiment, a waste outlet may be utilized to apply vacuum to the region in close proximity to the wafer backside 102b so as to remove any fluid, contaminants, or vapor that may be located on or near the backside 102b.

In one embodiment, as illustrated in FIG. 3A, it is believed that an analysis of wafer front side or backside 102a and 102b may reveal the existence of precipitated residue (e.g., HF residue) on wafer front side and backside 102a and 102b. Nonetheless, no liquid may be present. That is, it is believed that the portion of the wafer front side 102a and the portion of the wafer backside 102b previously occupied by front and back meniscus 150 and 152 may include precipitated residue. As will be described in more detail below, precipitated residue can be a residue generated as a result of removing fluid from front cleaning chemistry or back cleaning chemistry being used to clean and/or dry wafer front and backsides 102a and 102b. Thus, the embodiments of the present invention are designed to leave the wafer front side and backside 102a and 102b clean and dry subsequent to being cleaned and dried using the front or back cleaning chemistry inflows and IPA inflows without having to further rinse the wafer front side and backside 102a and 102b.

Figure 3B:
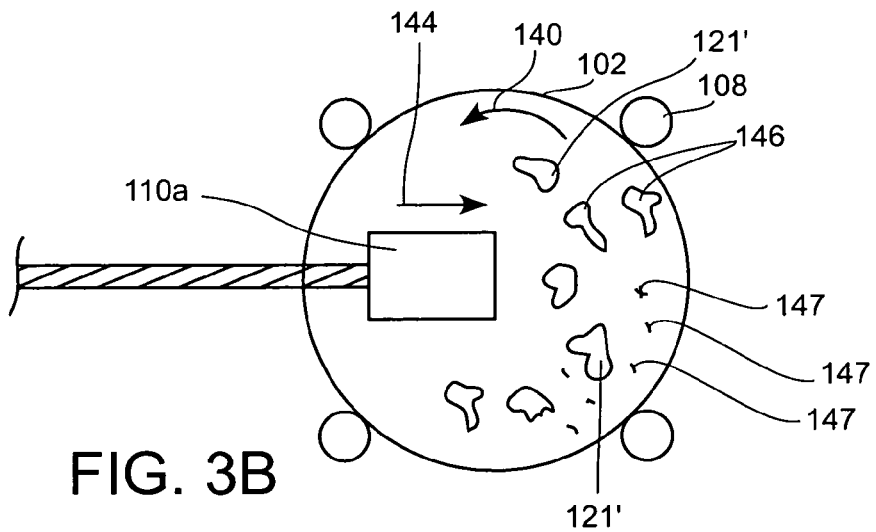
FIG. 3B is a simplified top view of the wafer front side illustrated in FIG. 3A with the wafer surfaces being cleaned and/or dried by the front proximity head, in accordance with still another embodiment of the present invention.

FIG. 3B is a simplified top view of the wafer front side 102a being cleaned and/or dried by the front proximity head 110a illustrated in FIG. 3A, in accordance with one embodiment of the present invention. The portion of the wafer front side 102a defined in front of the leading edge of the front proximity head 110a is shown to include drops 121' of brush scrubbing chemistry 121, contaminants 147, and liquid 146. It must be noted that liquid 146 can be any liquid that may have remained on the wafer front side 102a subsequent to any of the previous wafer processing operations (e.g., chemical mechanical planarization (CMP), etching, etc.).

According to one embodiment of the present invention, once the front proximity head 10a is moved in close proximity to the wafer front side 102a, front cleaning chemistry, and IPA inflows are introduced into the front proximity heads through fluid inlets 126a and 126b to generate the front meniscus 150 that is in contact with the wafer front side 102a. Almost simultaneously, liquid 146, drops 121' of the brush scrubbing chemistry 121, and contaminants 147 are vacuumed and removed from over the wafer front side 102a.

Figure 4A:
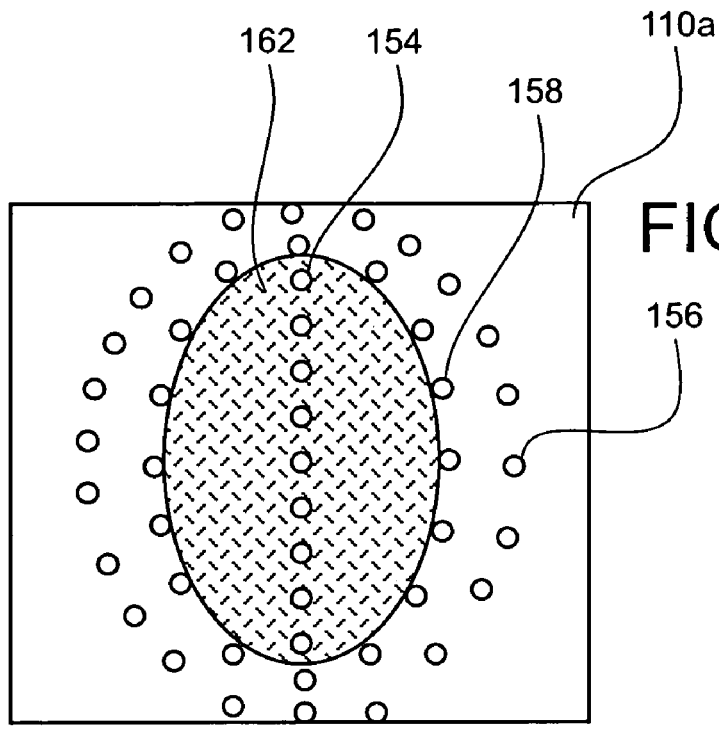
FIG. 4A is a simplified bottom view of an exemplary proximity head, in accordance with still another embodiment of the present invention.

FIG. 4A is a simplified top view of an exemplary front proximity head 110a, in accordance with one embodiment of the present invention. The front proximity head 10a is shown to have an oblong shape having a plurality of outlets design to introduce different types of fluid onto the wafer front side 102a as well as a plurality of vacuum inlets for almost simultaneously vacuuming fluid and contaminants from over the wafer front side 102a so as to clean and/or dry wafer front side 102a.

The plurality of front cleaning chemistry inlets 154 are defined substantially in the middle of the front proximity head 110a forming a substantially linear line designed to introduce liquid 146 onto the wafer front side 102a. Bordering the front cleaning chemistry inlets 154 is a plurality of vacuum outlets 158 designed to vacuum and eliminate contaminants and any type of fluid defined between the vacuum outlets 158 and the wafer front side 102a. As can further be seen, a plurality of isopropyl alcohol (IPA) inlets 156 are defined bordering the vacuum outlets 158, which in the embodiment shown in FIG. 4A, define an elliptic path.

In the illustrated embodiment, the front meniscus 150 is formed in an area confined within the elliptical path of the vacuum outlets 158.

Figure 4B:
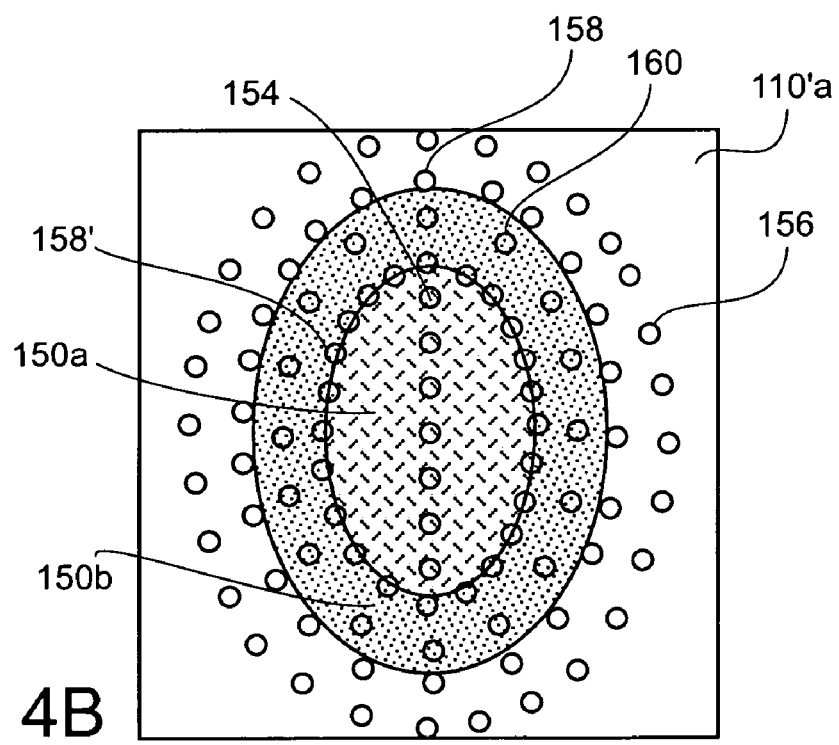
FIG. 4B a simplified bottom view of yet another exemplary proximity head, in accordance with still another embodiment of the present invention.

FIG. 4B depicts a simplified top view of an alternate front proximity head 110a, in accordance with another embodiment of the present invention. As can be seen, a plurality of vacuum outlets 158' is defined adjacent to the front cleaning chemistry inlets 154, a plurality of rinse inlets 160 is defined between the plurality of vacuum outlets 158' and the vacuum outlets 158. In one example, rinse inlets 160 are configured to introduce DIW inflow on to the wafer front side 102a so as to rinse the wafer surface 102a. According to the implementation shown in FIG. 4B, the front meniscus 150 defined between the front proximity head 110a and the wafer front side 102a can be compromised of two concentric meniscus, an inner meniscus 150a and an outer meniscus 150b. In one example, the inner meniscus 150a is generated by the solution of the front cleaning chemistry and DIW while the outer meniscus 150b is formed by the DIW inflow 160.

It must be noted that although the illustrated embodiments of the present invention include a plurality of front cleaning chemistry inlets 154, vacuum outlets 158 and 158', DIW inlet 160, and IPA vapor inlet 156, in another embodiment, the embodiments of the present invention may implement at least one front cleaning chemistry inlet 154, at least one IPA vapor inlet 156, at least one DIW inlet 160, and at least one vacuum outlet 158.

With respect to the back proximity head 120b, the at least one IPA vapor inlet 156 can be defined adjacent to the at least one vacuum outlet 158, which is in turn is defined adjacent to the at least one DIW inlet 160 so as to form an IPA-vacuum-DIW orientation. It must be noted by one of ordinary skill in the art that other types of orientations such as IPA-DIW-vacuum, DIW-vacuum-IPA, vacuum-IPA-DIW, etc. may be utilized depending on the wafer processes desired and type of wafer cleaning and/or drying mechanism being enhanced. In one preferred embodiment, the IPA-vacuum-DIW orientation is used to intelligently and powerfully generate, control, and move the back meniscus 152 located between the back proximity heads 110b and the wafer backside 102b. In another embodiment, IPA-vacuum orientation can be used to clean and/or dry wafer front and back sides 102a and 102b.

Still further, it must be noted that DIW inlets 160, the IPA vapor inlets 156, the vacuum outlets 158, and front cleaning chemistry and back cleaning chemistry inlets may be arranged on the top surface of the front and back proximity heads 110a and 110b in any suitable manner so long as respective meniscus can be generated and controlled. For example, in addition to the front cleaning chemistry inlet, IPA vapor inlet, the vacuum outlet, and the DIW inlet, in an additional embodiment, there may be additional sets of IPA vapor outlets, DIW inlets and/or vacuum outlets depending on the configuration of the proximity head desired.

Yet further, it should be appreciated that front and back proximity heads 110a and 110b can have any number and type of inlets and outlets and that inlets and outlets may be oriented on front and back proximity heads in any appropriate orientation. Still further, front and back meniscus 150 and 152 can be managed in any suitable manner by controlling the amount of flow of fluids onto wafer front and back sides 102a and 102b and by controlling the vacuum applied. Yet further, it should be appreciated that the size as well as the locations of the inlets and outlets may be varied on front and back proximity heads 110a and 110b so long as front and back meniscus 150 and 152 are stable.

Still further, one of ordinary skill in the art must appreciate that it is believed that the brush scrubbing proximity cleaning and/or drying system of the present invention can be used to clean the wafer front side and backside 102a and 102b without having a need to rinse the wafer front and back sides 102a and 102b with a rinsing fluid.

Figure 5A:
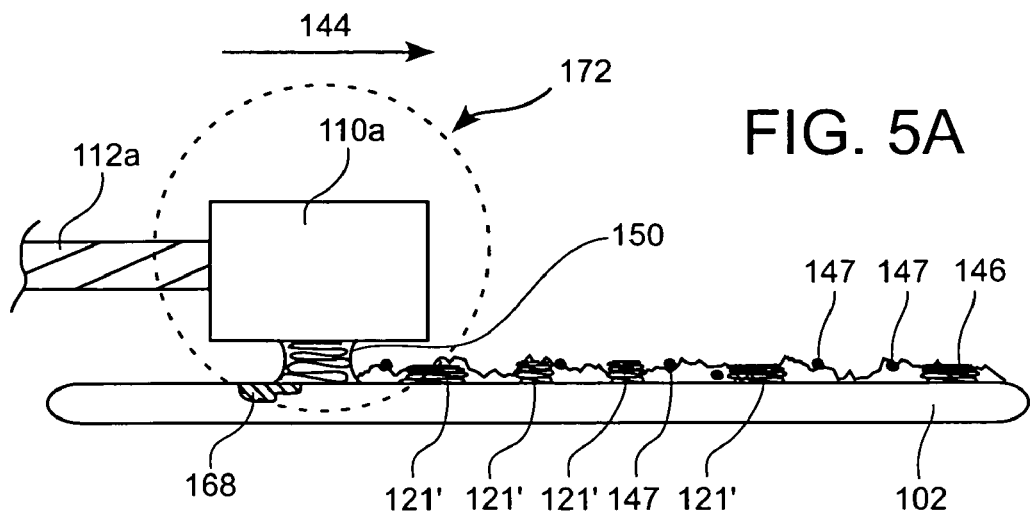
FIG. 5A depicts a simplified cross sectional view of the wafer front side being cleaned and/or dried by the front proximity head, in accordance with still another embodiment of the present invention.
Figure 5B:
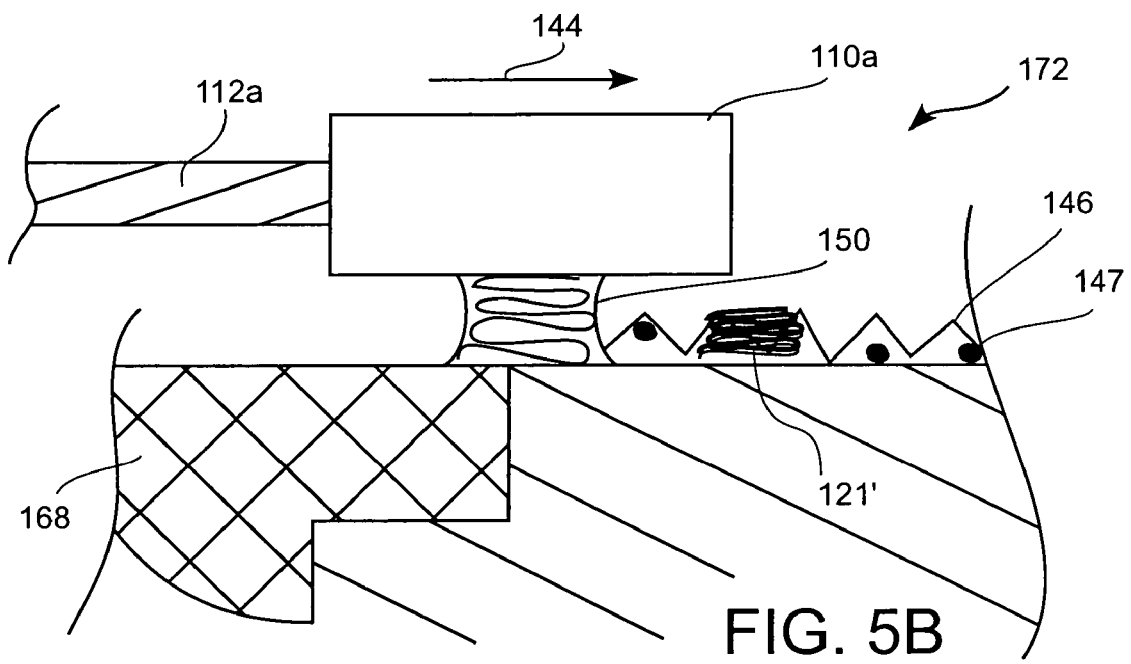
FIG. 5B is a simplified magnification of a region shown in FIG. 5A, in accordance with still another embodiment of the present invention.
Figure 5C:
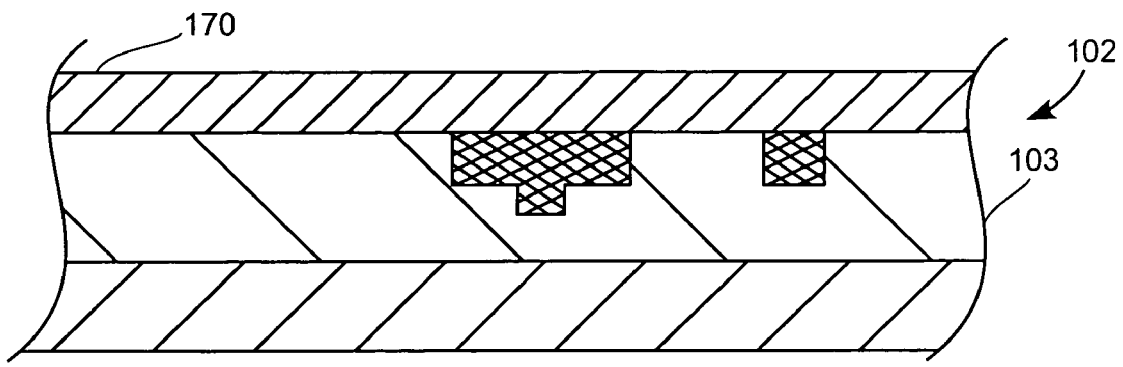
FIG. 5C is a simplified, partial, and enlarged cross sectional view of the wafer front surface including the plurality of metal lines having an oxide layer formed thereon after proximity cleaning and/or drying of the wafer front side, in accordance with still another embodiment of the present invention.

Reference is made to simplified cross sectional views depicted in FIGS. 5A-5C, showing cleaning and/or drying of the wafer front side 102a using the front proximity head 110a after brush scrubbing the wafer backside 102b, in accordance with one embodiment of the present invention. By way of example, in the illustrated embodiment, copper residue remaining over the wafer front side 102a is being removed after formation of copper metallization lines, using for instance, the mixture of HF and DIW. As the front proximity head 110a is traversing wafer front side 102a so as to clean and/or dry wafer front side 102a, copper residue as well as any liquid covering the wafer front side 102a is removed, leaving a visually clean and dry wafer front side 102a. According to one example, it is believed that precipitated HF residue may be detected upon close analysis of the wafer front side 102a. Thus, depending on the application and desired results, wafer front side 102a or wafer backside 102b may be rinsed off using DIW so as to remove any precipitated HF residue. It is believed that in most applications, the precipitated HF residue need not be rinsed. By way of example, in certain applications, having particulate residue between different layers formed over the substrate may not lead to any negative interactions, thus eliminating the need to rinse wafer front and backside 102a and 102b with DIW inflow.

FIG. 5A depicts a cross sectional view of the wafer front side 102a being cleaned and dried by the front proximity head 110a, in accordance with one embodiment of the present invention. As shown, portion of the wafer front side 102a defined ahead of the leading edge of the front proximity head 110a partially includes liquid, drops 121' of brush scrubbing chemistry 121, and contaminants 147. The wafer front side 102a is shown to be cleaned and dried while the proximity head 110a and thus the front meniscus 150 is moved in the direction 144.

The portion of the wafer front side 102a defined at the trailing edge of the front proximity head 110a is shown to be visually dry. That is, after the portion of the wafer front side 102a is processed, all of the liquid 146, contaminants 147, and brush scrubbing chemistry 121 are intermixed with the front meniscus 150 and thus removed, leaving a visually clean and dry wafer front side 102a. In one embodiment, however, it is believed that the portion of the wafer front side 102a cleaned and/or dried previously, may include precipitated residue left over subsequent to drying of the wafer front side 102a. As the front cleaning chemistry, back cleaning chemistry, and the brush scrubbing chemistry are configured to be chemically compatible, negative effects resulting from wafer front side 102a cross contamination caused by penetration of SC1 associated with the prior art is significantly eliminated.

FIG. 5B is a simplified, partial, and enlarged cross sectional view of the wafer front surface 102a having the plurality of metal lines 168 during cleaning and/or drying of the wafer front side 102a, according to one embodiment of the present invention. Contaminants 147, liquid 136, and drops 121' of brush scrubbing chemistry 121 partially covering the leading edge of the front proximity head 110a are shown to be removed by the movement of the front proximity head 110a. However, in one example, it is believed that precipitated residue may be detected at the trailing edge of the front proximity head 110*a*.

In one example, the front proximity head 110*a* cleanses and/or dries the wafer front side 102*a* using the mixture of HF and DIW inflow, IPA inflow, and vacuum to remove any type of liquid or contaminants remaining on the wafer front side 102*a*. According to one embodiment, while drying the wafer front side 102*a*, it is believed that precipitated residue of HF may be formed and remain on the portion of the wafer front side 102*a* being previously processed by the wafer front proximity head. FIG. 5C is a simplified, partial, and enlarged cross sectional view of the wafer front surface 102*a* having the plurality of metal lines 168 and an oxide layer 103 formed thereon subsequent to proximity cleaning and/or drying of the wafer front side 102*a*, according to one embodiment of the present invention.

In accordance with one embodiment of the present invention, when using a front cleaning chemistry and a back cleaning chemistry, the front cleaning chemistry and back chemistries can be a solution of HF and DIW. Depending on the type of application, however, a concentration of HF in the front cleaning chemistry and back cleaning chemistry may be equivalent or vary. According to one implementation, the concentration of HF in the back cleaning chemistry can range between approximately 10:1 and 1500:1, and more preferably between approximately 20:1 and 1000:1, and most preferably approximately 50:1. Like wise, the concentration of HF in the front cleaning chemistry can range between approximately 50:1 and 10,000:1, and more preferably between approximately 100:1 and 1000:1.

Figure 6A:
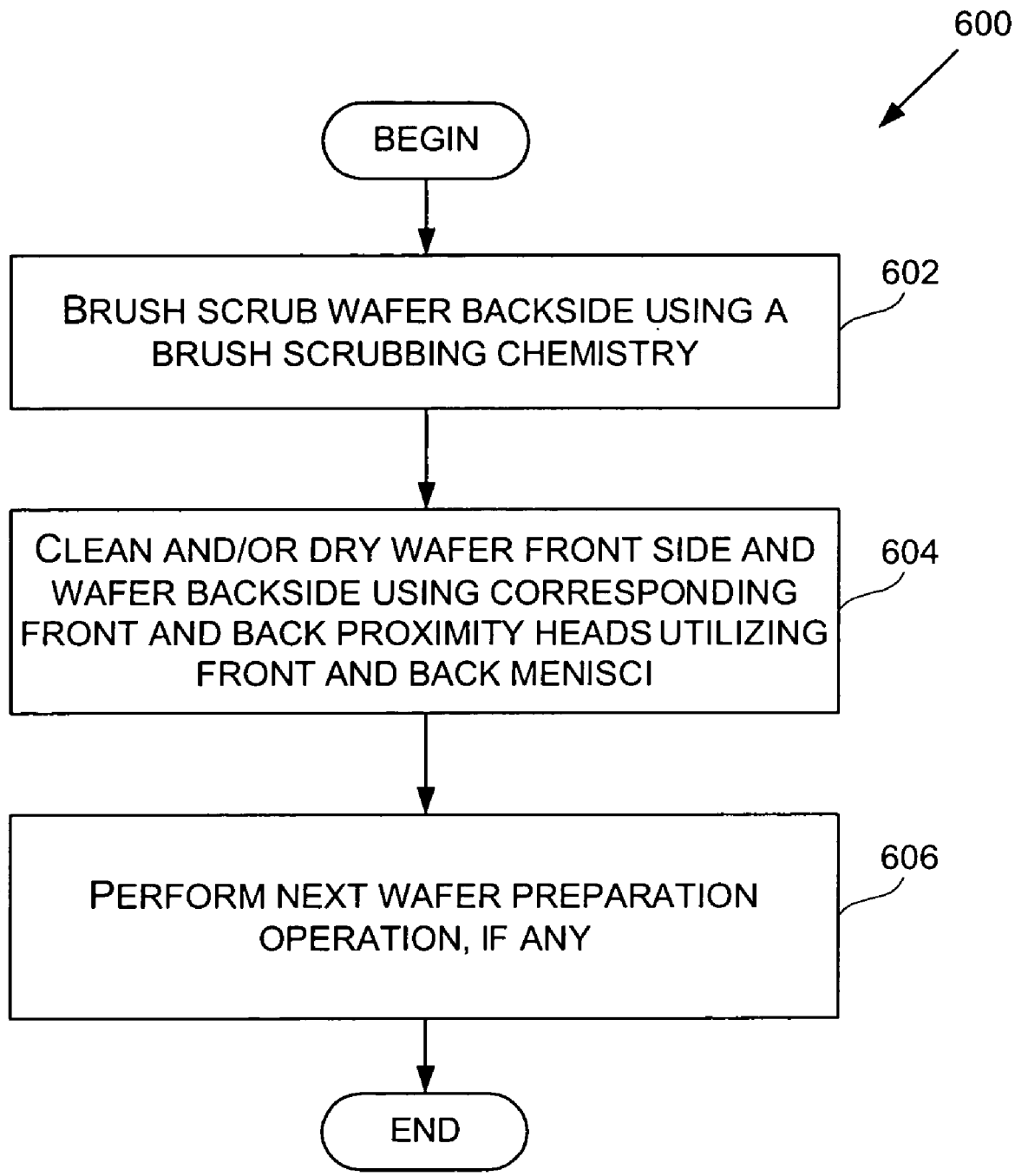
FIG. 6A is a flowchart diagram depicting method operations performed in an exemplary brush scrubbing proximity cleaning and/or drying system, in accordance with still another embodiment of the present invention.

Reference is made to a flowchart diagram 600 shown in FIG. 6A depicting method operations performed in an exemplary brush scrubbing proximity cleaning and/or drying system, in accordance with one embodiment of the present invention. The method begins in operation 602 in which the wafer backside is brush scrubbed using a brush scrubbing chemistry. In one example, the brush scrubbing chemistry is diluted HF having a concentration of approximately 100:1, and more preferably a concentration of approximately 1000:1. According to one implementation, the wafer front side and the wafer back side can be brush scrubbed almost simultaneously.

Next, in operation 604, the wafer front side and wafer backside are cleaned and/or dried using front and back meniscus formed between wafer front and backsides, correspondingly. A front cleaning chemistry is supplied to the front proximity head and a back cleaning chemistry is supplied to the back proximity head. The front and back chemistries are configured to be compatible with the brush scrubbing chemistry. In one embodiment, mixtures of HF and DIW are used to clean and/or dry the wafer front side and backside. Depending on the application and desired results, the concentration of HF in the front and back chemistries can be equivalent or may vary. In one example, the wafer front side can be cleaned and/or dried using the mixture of HF and DIW while the wafer backside is merely rinsed using DIW. Thereafter, the method continues to operation 606 in which the next wafer preparation operation is performed if such an operation exists.

Figure 6B:
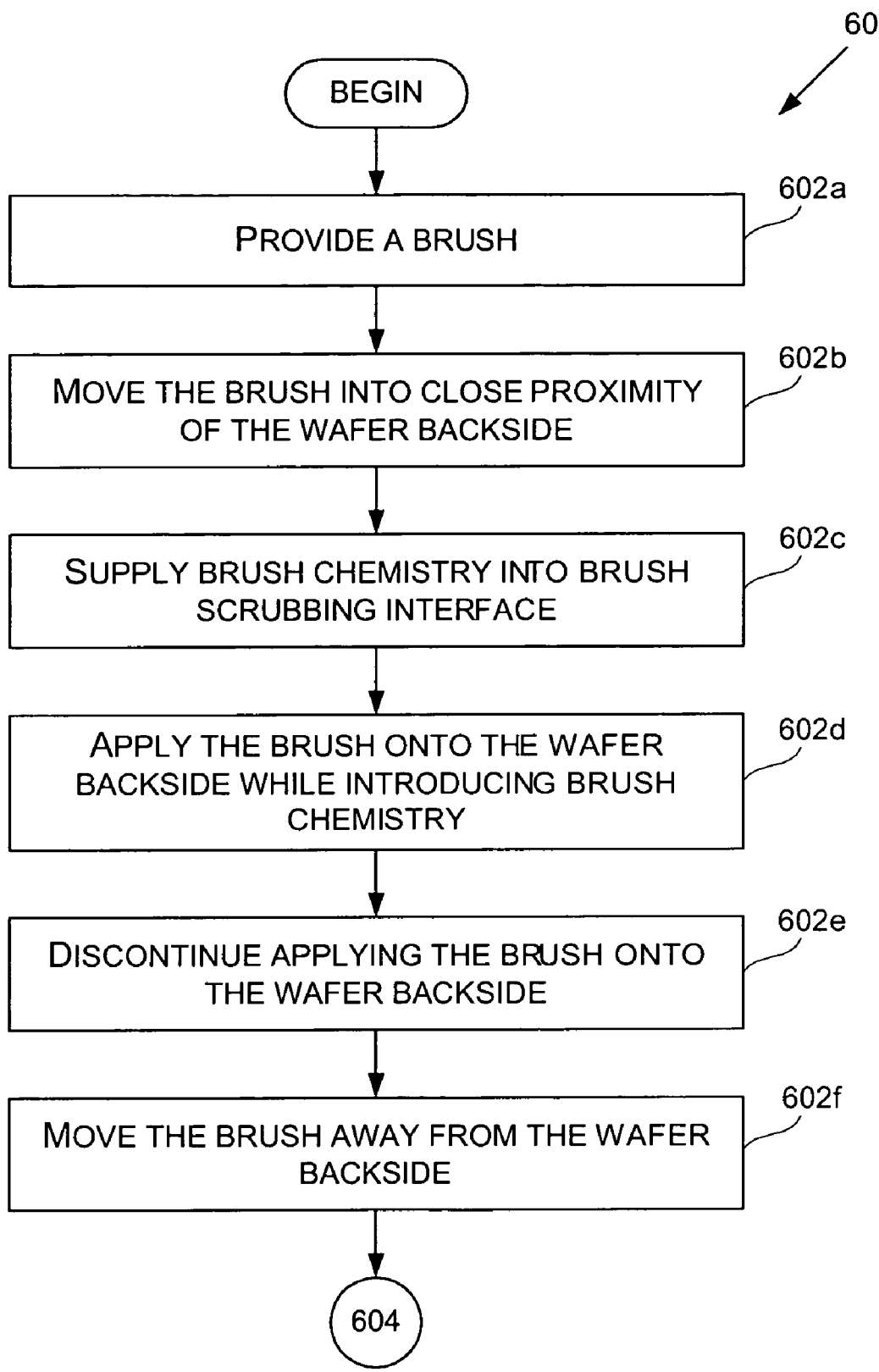
FIG. 6B is a flowchart diagram depicting method operations performed while brush scrubbing the wafer backside, in accordance with one embodiment of the present invention.

Continuing to the flowchart diagram shown in FIG. 6B, method operations performed while brush scrubbing the wafer backside can further be understood, according to one embodiment of the present invention. In operation 602*a*, a brush is provided, which in one example, can be a PVA brush. Next, in operation 602*b*, the brush is moved into close proximity of the wafer backside. In one instance, the brush which initially is defined below the wafer backside and close to the chamber bottom wall of the brush scrubbing proximity cleaning and/or drying module is moved so as to be defined in close proximity to the wafer backside. Thereafter, in operation 602*c*, brush scrubbing chemistry is introduced into the brush scrubbing interface. In one example, the brush scrubbing chemistry can be introduced through the brush.

Continuing to operation 602*d*, the brush is applied onto the wafer backside while brush scrubbing chemistry is being introduced. In one example, the brush is rotated and is moved in an arc direction so as to brush scrub the entire wafer backside. Next, applying the brush onto the wafer backside is discontinued in operation 602*e*. In this manner, any contaminants and liquid remaining on the wafer backside subsequent to any of the other wafer preparation operations are mostly removed from wafer backside.

At this point, the brush is moved away from the wafer backside in operation 602*f*. In one example, the brush is moved back to the initial position of the brush, which in one embodiment, is in close proximity to the module bottom wall. In this manner, the brush mechanics cannot interfere with the operation of front and back proximity heads. Any encroachment of the brush scrubbing chemistry onto the wafer front side can have minimal negative effect on the wafer preparation operation as the possibility of having side effects resulting from incompatible chemistries associated with the prior art is substantially eliminated.

Figure 6C:
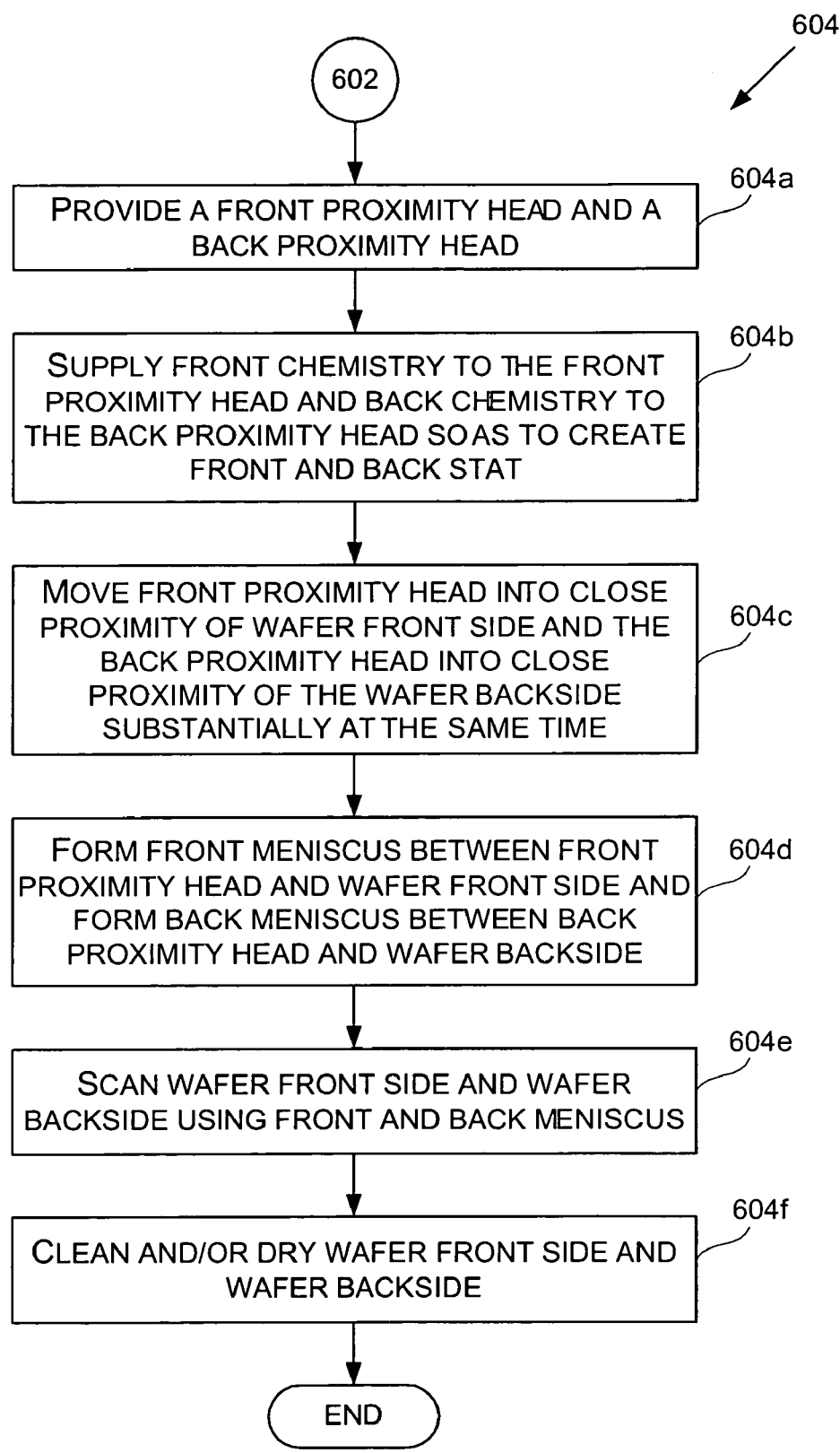
FIG. 6C is a flowchart diagram depicting method operations performed during proximity cleaning of wafer front and backsides, in accordance with still another embodiment of the present invention.

Reference is made to the flowchart diagram shown in FIG. 6C, depicting method operations performed during front and back proximity cleaning of wafer front and back sides, in accordance with one embodiment of the present invention. In operation 604*a*, a front proximity head and a back proximity head are provided. Next, front cleaning chemistry is supplied to the front proximity head and back cleaning chemistry is supplied to the back proximity head along with respective IPA inflows so that front meniscus and back meniscus can be created, in operation 604*b*. Depending on the application, in one example, the front and back chemistries can be the same chemistry having the same concentration or diverse concentrations. In one example, front and back chemistries are solutions of HF and DIW having the same or different concentrations of HF. In a different embodiment, a back cleaning chemistry may not be implemented thus allowing the rinsing of the wafer backside with DIW inflow.

In operation 604*d*, the front meniscus is formed between the wafer front side and the front proximity head and the back meniscus is formed between the back proximity head and the wafer backside. Thereafter, in operation 604*e*, wafer front side and backside are scanned using front and back proximity heads respectively.

It must be noted that by using compatible brush scrubbing chemistry and front and back chemistries, negative effects associated with having cross-contamination within the module are also eliminated. Additionally, the same waste mechanism can be used to eliminate brush scrubbing chemistry and front and back chemistries, thus simplifying the system.

According to one embodiment of the present invention, the brush scrubbing and proximity cleaning and/or drying module of the present invention can be incorporated in a clustered wafer processing system. For instance, after a wafer front side and/or backside has been pre-processed in an etching chamber, a chemical vapor deposition system, a chemical mechanical polishing (CMP) system, etc., the wafer front side and back side can be cleaned and/or dried in the system of the present invention. Thereafter, the wafer backside and/or front side can be post-processed in an etching chamber, a chemical vapor deposition (CVD) system, physical vapor deposition (PVD) system, electrochemical deposition (ECD) system, an atomic layer deposition (ALD) system, a lithographic processing system (including coater and stepper) module, etc.

Of course, it must be noted that wafer pre-processing may be performed in any other apparatus, systems, and modules capable of providing other substrate preparation operations (e.g., spin, rinse, and dry module, proximity vapor process module, rapid thermal processing systems, etch systems, etc.).

For additional information about the proximity vapor clean and dry system, reference can be made to and exemplary system described in the U.S. Pat. No. 6,488,040, issued on Dec. 3, 2002, having inventors John M. de Larios, Mike Ravkin, Glen Travis, Jim Keller, and Wilbur Krusell, and entitled "CAPILLARY PROXIMITY HEADS FOR SINGLE WAFER CLEANING AND DRYING." This U.S. patent application, which is assigned to Lam Research Corporation, the assignee of the subject application, is incorporated herein by reference.

For additional information with respect to the proximity head, reference can be made to an exemplary proximity head, as described in the U.S. Pat. No. 6,616,772, issued on Sep. 9, 2003, having inventors John M. de Larios, Mike Ravkin, Glen Travis, Jim Keller, and Wilbur Krusell, and entitled "METHODS FOR WAFER PROXIMITY CLEANING AND DRYING." This U.S. patent application, which is assigned to Lam Research Corporation, the assignee of the subject application, is incorporated herein by reference.

For additional information about top and bottom meniscus, reference can be made to the exemplary meniscus, as disclosed in U.S. patent application Ser. No. 10/330,843, filed on Dec. 24, 2002, having inventor Carl Woods, and entitled "MENISCUS, VACUUM, IPA VAPOR, DRYING MANIFOLD." This U.S. patent application, which is assigned to Lam Research Corporation, the assignee of the subject application, is incorporated herein by reference.

For additional information about top and bottom meniscus, vacuum, and IPA vapor, reference can be made to the exemplary system, as disclosed in U.S. patent application Ser. No. 10/330,897, filed on Dec. 24, 2002, having inventor Carl Woods, and entitled "SYSTEM FOR SUBSTRATE PROCESSING WITH MENISCUS, VACUUM, IPA VAPOR, DRYING MANIFOLD." This U.S. patent application, which is assigned to Lam Research Corporation, the assignee of the subject application, is incorporated herein by reference.

For additional information about proximity processors, reference can be made to the exemplary processor, as disclosed in U.S. patent application Ser. No. 10/404,270, filed on Mar. 31, 2003, having inventors James P. Garcia, Mike Ravkin, Carl Woods, Fred C. Redeker, and John M. de Larios, and entitled "VERTICAL PROXIMITY PROCESSOR." This U.S. patent application, which is assigned to Lam Research Corporation, the assignee of the subject application, is incorporated herein by reference.

For additional information about front and back meniscus, reference can be made to the exemplary dynamic meniscus, as disclosed in U.S. patent application Ser. No. 10/404,692, filed on Mar. 31, 2003, having inventors James P. Garcia, John M. de Larios, Michael Ravkin, and Fred C. Redeker, and entitled "METHODS AND SYSTEMS FOR PROCESSING A SUBSTRATE USING A DYNAMIC LIQUID MENISCUS." This U.S. Patent Application, which is assigned to Lam Research Corporation, the assignee of the subject application, is incorporated herein by reference.

For additional information about meniscus, reference can be made to the exemplary dynamic liquid meniscus, as disclosed in U.S. patent application Ser. No. 10/603,427, filed on Jun. 24, 2003, having inventors Carl A. Woods, James P. Garcia, and John M. de Larios, and entitled "METHODS AND SYSTEMS FOR PROCESSING A BEVEL EDGE SUBSTRATE USING A DYNAMIC LIQUID MENISCUS." This U.S. patent application, which is assigned to Lam Research Corporation, the assignee of the subject application, is incorporated herein by reference.

For additional information about proximate cleaning and/or drying, reference can be made to the exemplary wafer process, as disclosed in U.S. patent application Ser. No. 10/606,022, filed on Jun. 24, 2003, having inventors John M. Boyd, John M. de Larios, Michael Ravkin, and Fred C. Redeker, and entitled "SYSTEM AND METHOD FOR INTEGRATING IN-SITU METROLOGY WITHIN A WAFER PROCESS." This U.S. patent application, which is assigned to Lam Research Corporation, the assignee of the subject application, is incorporated herein by reference.

For additional information about depositing and planarizing thin films of semiconductor wafers, reference can be made to the exemplary apparatus and method, as disclosed in U.S. patent application Ser. No. 10/607,611, filed on Jun. 27, 2003, having inventors John Boyd, Yezdi N. Dordi, and John M. de Larios, and entitled "APPARATUS AND METHOD FOR DEPOSITING AND PLANARIZING THIN FILMS OF SEMICONDUCTOR WAFERS." This U.S. patent application, which is assigned to Lam Research Corporation, the assignee of the subject application, is incorporated herein by reference.

For additional information about cleaning a substrate using megasonic cleaning, reference can be made to the exemplary method and apparatus, as disclosed in U.S. patent application Ser. No. 10/611,140, filed on Jun. 30, 2003, having inventors John M. Boyd, Mike Ravkin, Fred C. Redeker, and John M. de Larios, and entitled "METHOD AND APPARATUS FOR CLEANING A SUBSTRATE USING MEGASONIC POWER." This U.S. patent application, which is assigned to Lam Research Corporation, the assignee of the subject application, is incorporated herein by reference.

For additional information about proximity brush cleaning, reference can be made to the exemplary proximity brush, as disclosed in U.S. patent application Ser. No. 10/742,303, filed on Dec. 18, 2003, having inventors John M. Boyd, Michael L. Orbock, and Fred C. Redeker, and entitled "PROXIMITY BRUSH UNIT APPARATUS AND METHOD." This U.S. patent application, which is assigned to Lam Research Corporation, the assignee of the subject application, is incorporated herein by reference.

Yet further, in one exemplary implementation, the brush scrubbing proximity cleaning and/or drying system of the present invention can be implemented in a clustered wafer cleaning apparatus that may be controlled in an automated way by a control station. For instance, the clustered cleaning apparatus may include a sender station, a brush scrubbing proximity cleaning and/or drying module, and a receiver station. Broadly stated, wafers initially placed in the sender station are delivered, one-at-a-time, to the brush scrubbing proximity cleaning and/or drying module. After being scrubbed and proximity cleaned and/or dried in the brush scrubbing proximity cleaning and/or drying module, dry wafers are then delivered to the receiver station for being stored temporarily. One of ordinary skill in the art must appreciate that in one embodiment, the clustered cleaning apparatus can be implemented to carry out a plurality of different substrate preparation operations (e.g., cleaning, etching, buffing, etc.).

Although the foregoing invention has been described in some detail for purposes of clarity of understanding, it will be apparent that certain changes and modifications may be practiced within the scope of the appended claims. For example, the embodiments of the present invention can be implemented to clean any substrate having varying sizes and shapes such as those employed in the manufacture of semiconductor devices, flat panel displays, hard drive discs, flat panel displays, and the like. Additionally, the present embodiments are to be considered as illustrative and not restrictive, and the invention is not to be limited to the details given herein, but may be modified within the scope and equivalents of the appended claims.

What is claimed is:

1. A substrate preparation system, the system comprising:
a brush coupled to a shaft, the shaft arranged to move between a second height (H2) that is closer to a back surface of the substrate when present and a first height (H1) that is further apart from the surface of the substrate when present, the brush positioned in the second height facilitating a brush scrub of a back surface of a substrate;
a front head defined to be positioned in close proximity to a front surface of the substrate, the front head having a plurality of conduits for delivering and removing a fluid so as to define a fluid meniscus between the front head and a front surface of the substrate; and
a back head defined to be positioned in close proximity to the back surface of the substrate, the back head being positioned substantially opposite to the front head, and the back head having a plurality of conduits for delivering and removing a fluid so as to define a fluid meniscus between the back head and the back surface of the substrate,
wherein the front head and the back head are coupled to arms that orient the front head and the back head in a path that is horizontal and substantially parallel to the substrate and the arms orient the front head and the back head in a vertical direction to enable defining the front head and the back head in close proximity to the front surface of the substrate and the back surface of the substrate, respectively,
wherein the first height of shaft that couples to the brush is spaced apart from the path of the back head.

2. A system as recited in claim 1, wherein the front head is configured to scan the front surface of the substrate and the back head is configured to scan the back surface of the substrate substantially synchronously.

3. A system as recited in claim 1, the plurality of conduits of the front head including a first front conduit, a second front conduit, and a third front conduit, wherein the first front conduit, the second front conduit, and the third front conduit are configured to act substantially simultaneously when in operation.

4. A system as recited in claim 3, wherein the first front conduit is configured to deliver a primary front fluid onto the front surface of the substrate, the second front conduit is configured to deliver a secondary front fluid, and the third front conduit is configured to remove the front primary fluid and the secondary front fluid from over the front surface of the substrate.

5. A system as recited in claim 1, the plurality of conduits of the back head including a first back conduit, a second back conduit, and a third back conduit, wherein the first back conduit, the second back conduit, and the third back conduit are configured to act substantially simultaneously when in operation.

6. A system as recited in claim 5, wherein the first back conduit is configured to deliver a primary back fluid onto the back surface of the substrate, the second back conduit is configured to deliver a secondary back fluid, and the third back conduit is configured to remove the primary back fluid and the secondary back fluid from over the back surface of the substrate.

7. A system as recited in claim 1, further comprising:
a front arm secured to the front head for moving the front head into close proximity of the front surface of the substrate; and
a back arm secured to the back head for moving the back head into close proximity of the back surface of the substrate substantially at the same time as the front head.

8. A system as recited in claim 1, wherein each of the first head and second head include head surfaces that have flat surface regions with conduits, and each of the conduits are defined by discrete holes that reside at the head surfaces and extend through the flat surface regions of the head surfaces.

9. A substrate preparation system, the system comprising:
a brush configured to brush scrub a back surface of a substrate using a brush scrubbing chemistry;
a front head defined in close proximity to a front surface of the substrate, the front head configured to prepare the front surface of the substrate using a front meniscus; and
a back head defined in close proximity to the back surface of the substrate, the back head being positioned substantially opposite to the front head, the back head configured to prepare the back surface of the substrate using a back meniscus,
wherein the front head and the back head are applied as a pair to the substrate when the brush is apart from the substrate, and further wherein the front meniscus and the back meniscus are configured to include a chemistry that is compatible with the brush scrubbing chemistry;
wherein each of the first head and second head include head surfaces that have flat surface regions with conduits, and each of the conduits are defined by discrete holes that reside at the head surfaces and extend through the flat surface regions of the head surfaces.

10. A system as recited in claim 9, wherein the front head is configured to scan the front surface of the substrate and the back head is configured to scan the back surface of the substrate substantially synchronously.

11. A system as recited in claim 9, wherein the chemistry included in the front head and the back head being compatible with the brush scrubbing chemistry is configured to prevent chemical contamination of the front surface of the substrate.

12. A system as recited in claim 9, wherein the front meniscus is configured to include a front cleaning chemistry and the back meniscus includes a back cleaning chemistry.

13. A system as recited in claim 12, wherein the brush scrubbing chemistry includes hydrofluoric acid.

14. A system as recited in claim 13, wherein the front cleaning chemistry includes hydrofluoric acid.

15. A system as recited in claim 9, wherein each of the front meniscus and the back meniscus includes isopropyl alcohol (IPA) vapor, nitrogen, organic compounds, hexanol, ethyl glycol, or compounds mixable with water.

16. A substrate preparation system, the system comprising:
a brush coupled to a shaft, the shaft arranged to move between a second height (H2) that is closer to a back surface of the substrate when present and a first height (H1) that is further apart from the surface of the substrate when present, the brush positioned in the second height facilitating a brush scrub of a back surface of a substrate;

a front head having a plurality of conduits for delivering and removing a fluid, the front head defined to be positioned in close proximity to a front surface of the substrate; and a back head having a plurality of conduits for delivering and removing a fluid, the back head defined to be positioned in close proximity to the back surface of the substrate, the back head being positioned substantially opposite to the front head, wherein the front head and the back head are coupled to arms that position the front head and the back head along a path that is horizontal and substantially parallel to the front and back surfaces of substrate, and the arms position the front head and the back head along a vertical direction that is perpendicular to the path to position the front head and the back head in close proximity to the front surface of the substrate and the back surface of the substrate, respectively, wherein the first height of shaft that couples to the brush is spaced apart from the path of the back head.

* * * * *